(12) United States Patent  
Kuo et al.

(10) Patent No.: US 8,841,931 B2  
(45) Date of Patent: Sep. 23, 2014

(54) PROBE CARD WIRING STRUCTURE (75) Inventors: Yung-Hsin Kuo, Zhubei (TW); Wensen Hung, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 329 days.

(21) Appl. No.: 13/014,846

(22) Filed: Jan. 27, 2011

(65) Prior Publication Data  
US 2012/0194210 A1 Aug. 2, 2012

(51) Int. Cl.  
G01R 31/20 (2006.01)  
G01R 31/00 (2006.01)  
G01R 1/073 (2006.01)

(52) U.S. Cl.  
CPC .................. G01R 1/07378 (2013.01)  
USPC ............. 324/754.07; 324/756.03; 324/754.13

(58) Field of Classification Search  
CPC . G01R 31/2831; G01R 1/073; G01R 31/2863  
USPC .................................................... 324/757.04  
See application file for complete search history.

(56) References Cited

U.S. PATENT DOCUMENTS

| | | | |
|---|---|---|---|
| 5,442,144 A * | 8/1995 | Chen et al. .................... 174/266 |
| 5,736,850 A * | 4/1998 | Legal ....................... 324/754.07 |
| 5,801,432 A * | 9/1998 | Rostoker et al. .............. 257/666 |
| 6,130,546 A * | 10/2000 | Azizi ........................ 324/755.04 |
| 6,297,657 B1 * | 10/2001 | Thiessen et al. .......... 324/754.13 |
| 6,661,244 B2 * | 12/2003 | McQuade et al. ........ 324/756.03 |
| 6,727,714 B2 * | 4/2004 | Deguchi .................... 324/750.25 |
| 6,812,720 B1 * | 11/2004 | Cheng et al. ............. 324/754.07 |
| 7,180,318 B1 * | 2/2007 | Mahoney et al. ......... 324/756.03 |
| 7,245,134 B2 * | 7/2007 | Granicher et al. ....... 324/754.07 |
| 7,504,822 B2 * | 3/2009 | Parrish et al. ............ 324/756.03 |
| 7,692,436 B2 * | 4/2010 | Garabedian et al. ..... 324/756.03 |
| 7,714,598 B2 * | 5/2010 | Eldridge et al. ......... 324/754.14 |
| 8,222,912 B2 * | 7/2012 | Dang et al. ............... 324/755.01 |

(Continued)

OTHER PUBLICATIONS

Otto Weeden, Senior Applications Engineer Keithley Instruments, Inc., Probe Card Tutorial, Copyright 2003 Keithley Instruments, Inc. Printed in the U.S.A. No. 2437 0303, Keithley Instruments, Inc. 28775 Aurora Road o Cleveland, Ohio 44139 o 440-248-0400 o Fax: 440-248-6168, 1-888-KEITHLEY (534-8453) o www.keithley.com.*

(Continued)

*Primary Examiner* — Jermele M Hollington  
*Assistant Examiner* — Christopher McAndrew  
(74) *Attorney, Agent, or Firm* — Haynes and Boone, LLP (57) ABSTRACT

The present disclosure provides a probe card for wafer level testing. The probe card includes a space transformer having first power/ground lines and first signal lines embedded therein, wherein the first power/ground and signal lines are configured to have a first wiring pitch on a first surface and a second wiring pitch on a second surface, the second wiring pitch being substantially less than the first wiring pitch; a printed circuit board bonded to the first surface of the space transformer, wherein the printed circuit board includes second power/ground lines and second signal lines embedded in the printed circuit board and coupled to the first power/ground and signal lines; and conductive lines configured to a surface of the printed circuit board remote to the first surface of the space transformer, wherein each of the conductive lines includes a first end coupled to one of the second signal lines and a second end coupled to a different location of the printed circuit board.

11 Claims, 7 Drawing Sheets

(56) References Cited

U.S. PATENT DOCUMENTS

| | | | |
|---|---|---|---|
| 8,278,956 B2* | 10/2012 | Losey et al. | 324/756.03 |
| 8,322,020 B2* | 12/2012 | Hsu et al. | 29/602.1 |
| 2002/0190743 A1* | 12/2002 | Nakata et al. | 324/765 |
| 2003/0027423 A1* | 2/2003 | Zhou et al. | 438/689 |
| 2005/0156611 A1* | 7/2005 | Shinde et al. | 324/754 |
| 2006/0006892 A1* | 1/2006 | Green et al. | 324/755 |
| 2006/0125498 A1* | 6/2006 | Liu et al. | 324/754 |
| 2007/0096755 A1* | 5/2007 | Parrish et al. | 324/754 |
| 2008/0186037 A1* | 8/2008 | Ko | 324/754 |
| 2008/0284037 A1* | 11/2008 | Andry et al. | 257/774 |
| 2009/0184725 A1* | 7/2009 | Tunaboylu | 324/754 |
| 2009/0224790 A1* | 9/2009 | Jeon et al. | 324/762 |
| 2010/0117673 A1* | 5/2010 | Lee et al. | 324/761 |
| 2011/0063066 A1* | 3/2011 | Choi et al. | 336/200 |
| 2012/0023730 A1* | 2/2012 | Chong et al. | 29/428 |
| 2012/0081140 A1* | 4/2012 | Shim et al. | 324/755.03 |
| 2012/0169367 A1* | 7/2012 | Kuo et al. | 324/756.03 |

OTHER PUBLICATIONS

Otto Weeden, Senior Applications Engineer Keithley Instruments Inc., Probe Card Tutorial, Keithley Instruments, Inc. 28775 Aurora Road o Cleveland, Ohio 44139 o 440-248-0400 o Fax: 440-248-6168, 1-888-KEITHLEY (534-8453) o www.keithley.com © Copyright 2003 Keithley Instruments, Inc. No. 2437 Printed in the U.S.A. 0303.*

Dirk D. Brown, Zhineng Fan, Hongjun Yao, Sangjin Hong and Che-Yu Li, "Two Fundamental Approaches to Enabling High Performance LGA Connections", HDC Inc., Sunnyvale, California, pp. 508-513.

* cited by examiner

PROBE CARD WIRING STRUCTURE

CROSS REFERENCE

The present disclosure is related to the following commonly-assigned U.S. patent application, the entire disclosure of which is incorporated herein by reference: U.S. patent application Ser. No. 12/982,541 filed Dec. 30, 2010 by inventors Yung-Hsin Kuo and Wensen Hung for "HIGH FREQUENCY PROBING STRUCTURE".

BACKGROUND

Semiconductor manufacturing implements wafer probe testing in backend processing to qualify and sort integrated circuit (IC) dies on a wafer before wafer dicing. In a wafer probe test, a probe card is used and configured to couple a tester to a wafer to be tested. The probe card includes a substrate electrically interconnected to a printed circuit board (PCB). In a standard probe card, the PCB and the substrate are specifically designed for a type of wafer to be tested. When a new production rolls out and the corresponding standard probe card is not ready, a provisional probe card is used for wafer testing. The provisional probe card uses manual wiring from the substrate to the PCB. The wires of the substrate have a small pitch and are crowed in a small area. Manual wiring in the substrate's crowed wiring area increases wiring difficulty and decreases wiring repeatability. For example, poor wiring length control causes uneven and unreliable electrical performance of the probe card. Accordingly, corresponding test results from provisional probe cards degrade test results and provide inaccurate test data. Therefore, a probe card structure and method of making the same are needed to address the above issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 1:
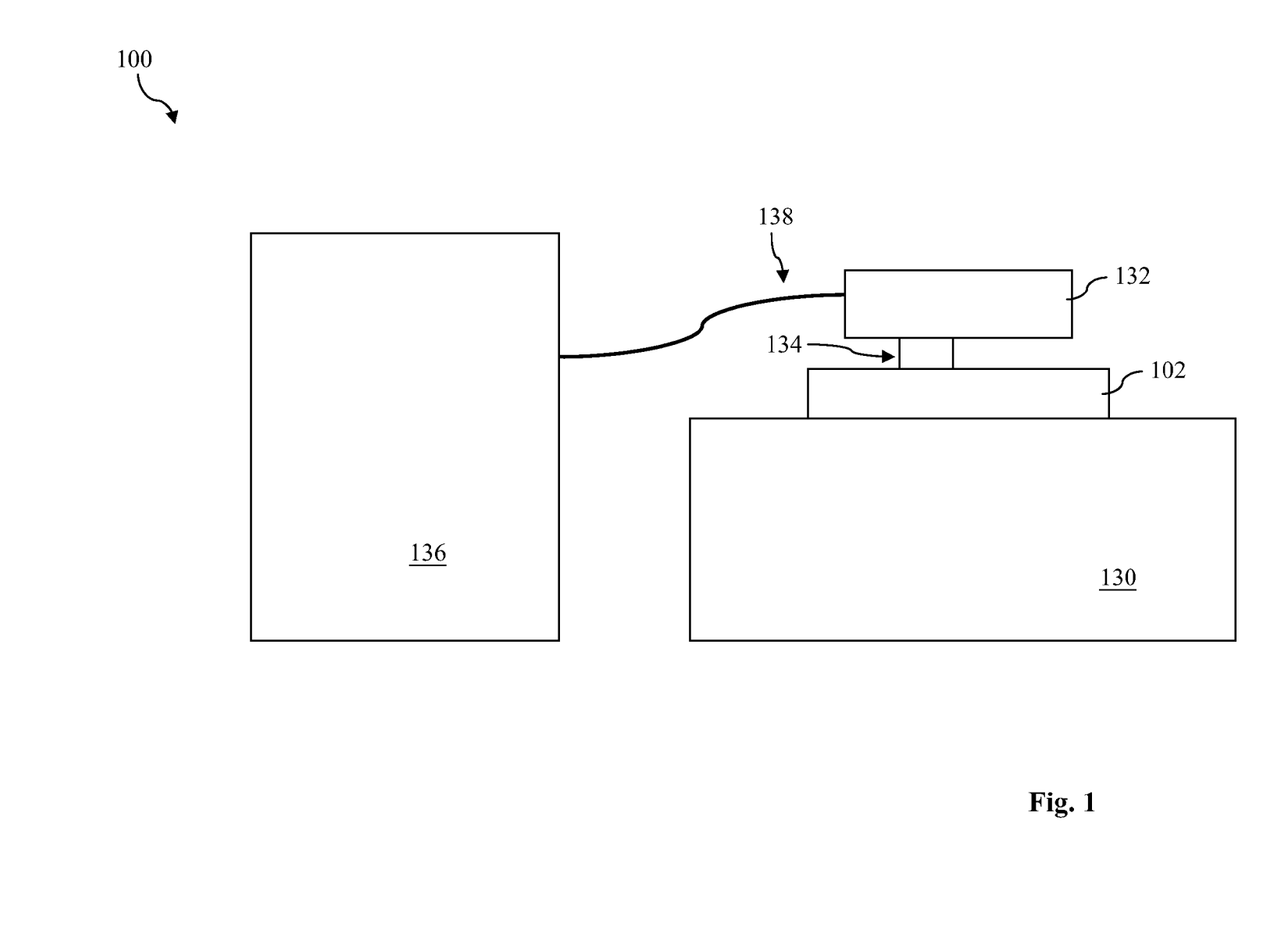
FIG. 1 is a schematic view of one embodiment of a wafer-level test system constructed according to various aspects of the present disclosure.

FIG. 1 is a schematic view of one embodiment of a wafer-level test system (or wafer test system) 100 constructed according to aspects of the present disclosure. The wafer-level test system 100 is designed to test a semiconductor wafer 102 at various stages for different purposes including acceptance test, characterization test, burn-in/stress test, or production test. An exemplary semiconductor wafer 102 is further illustrated in FIG. 2 in a top view. The semiconductor wafer 102 includes a substrate 104, such as a silicon substrate. Alternatively, the substrate 104 may include another elementary semiconductor, such as germanium. The substrate 104 may also include a compound semiconductor, such as silicon germanium, silicon carbide, gallium arsenic, indium arsenide, gallium nitride, and indium phosphide. The substrate 104 may include an alloy semiconductor, such as silicon germanium carbide, gallium arsenic phosphide, and gallium indium phosphide. The substrate 104 may include an epitaxial layer. For example, the substrate may have an epitaxial layer overlying a bulk semiconductor. Furthermore, the substrate 104 may include a semiconductor-on-insulator (SOI) structure. For examples, the substrate may include a buried oxide (BOX) layer formed by a process such as separation by implanted oxygen (SIMOX).

Figure 2:
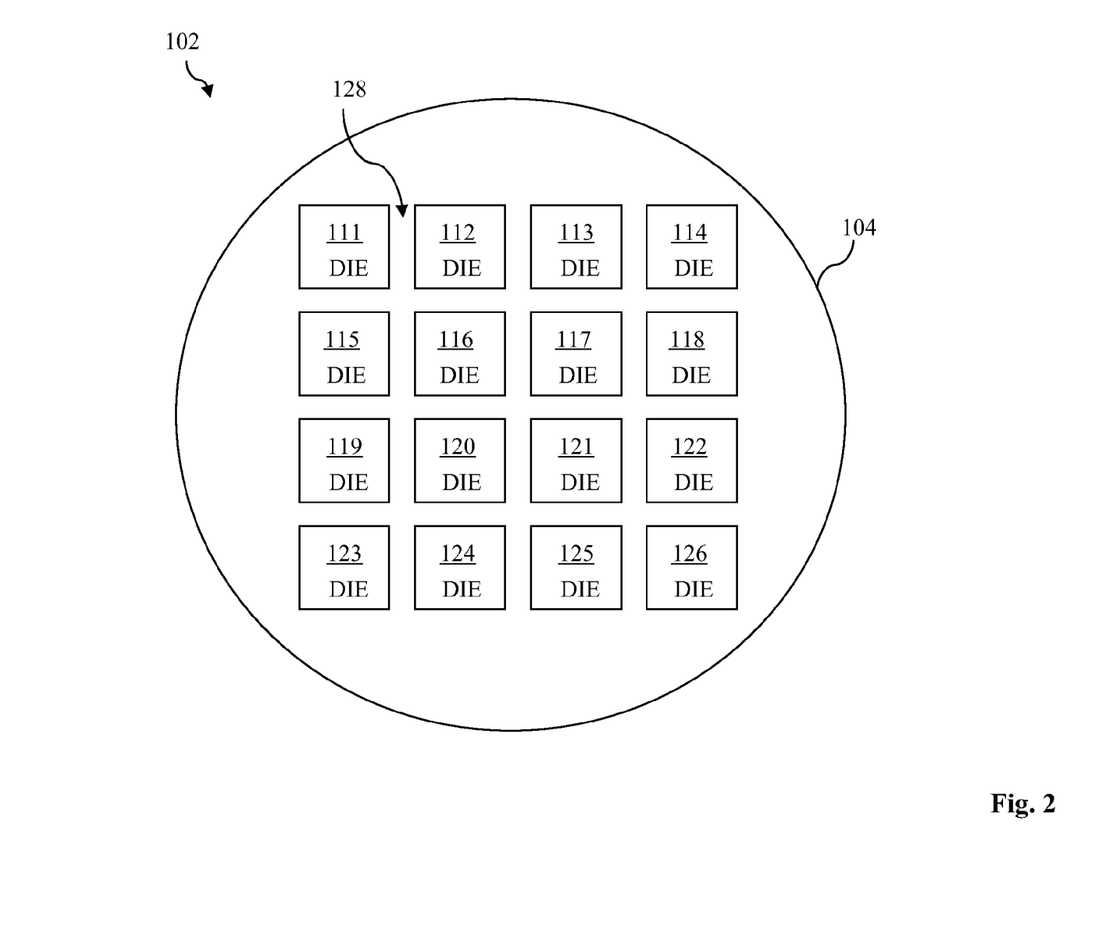
FIG. 2 is a top view of a semiconductor wafer to be tested by the wafer-level test system of FIG. 1.

The substrate 104 may include various p-type doped regions and/or n-type doped regions, implemented by a process such as ion implantation and/or diffusion. These doped regions in the substrate 104 may provide various functional devices or features, such as metal-oxide-semiconductor (MOS) transistors, imaging sensors, and combinations thereof. The substrate 104 may include lateral isolation features disposed to separate various devices formed on the substrate 104. For example, the substrate 104 includes shallow trench isolation (STI) formed by a process including lithography patterning process, etching, and dielectric material deposition. The substrate 104 may further at least partially include a plurality of patterned dielectric layers and patterned conductive layers combined to form interconnections configured to couple the various p-type and n-type doped regions and the other functional features. For example, the substrate 104 may include a portion of a multi-layer interconnect (MLI) structure and an inter-level dielectric (ILD) disposed in the MLI structure.

The semiconductor wafer 102 includes a plurality of dies 111-126. Each of the dies 111-126 includes an integrated circuit (IC) having various electrical features configured and coupled to form a functional circuit or an electrical device. In various embodiments, the integrated circuit includes a field-effect transistor (FET), a light-emitting diode (LED), an imaging sensor, a memory device, a high power transistor, or a high frequency device. In various examples, the integrated circuits formed in the dies of the wafer 102 include high frequency devices, such as blue tooth devices or 3G communication devices.

The dies 111-126 also each include a plurality of bonding pads (not illustrated) that can make electrical contact with a probe card. Various electrical parameters are gathered through testing the dies 111-126. The dies 111-126 are separated on the wafer 102 by a plurality of scribe street (or scribe line) 128. The scribe street 128 is a region of the wafer 102 that will be sawed in a later process, so that the dies 111-126 will be separated and packaged as IC dies. In one example, a plurality of test keys are implemented in the scribe street 128.

The test keys each include a plurality of test pads that can make electrical contact with the probe card.

Referring back to FIG. 1, the wafer test system 100 includes a wafer prober 130 designed to hold the wafer 102 and a probe card 132, and further designed to manipulate the probe card 132, such that the probe card 132 can step across the wafer 102 and contact each die of the wafer for testing. In another embodiment, multiple dies, such as a subset of the plurality of dies can be tested in parallel by the disclosed wafer test system 100. More particularly, a group of 2, 4, 8, or 16 dies are tested in parallel by the wafer test system 100 according to various examples.

The wafer test system 100 includes the probe card 132 positioned on the wafer 102 and configured to contact the wafer 102 through a plurality of needles (or probes) 134 integrated with the probe card 132. The plurality of needles 134 are operable to electrically contact the bonding pads of one die in the wafer 102 for providing testing currents/voltages and collecting testing results. In one embodiment, the needles 134 include tungsten or tungsten/rhenium alloy. In another embodiment, the needles 134 include beryllium copper or palladium. In yet another embodiment, each of the needles 134 has one end that tapers down to a sharp point.

The probe card 132 provides an interface to couple the wafer 102 to a testing module (or a tester) 136 through a connection cable 138. The tester 136 includes an electric test circuit to provide testing signals and collect testing results from the wafer 102. The tester 136 further includes a computer-based control system to control the test procedure; coordinate testing events among the wafer prober 130, the probe card 132, and the electric test circuit; and analyze the test results to evaluate the wafer 102.

The wafer test system 100 may further include a test head (not shown) to secure the probe card 132 and enable the stepping control of the probe card 132 by the wafer prober 130. The wafer test system 100 may further include a probe interface board (PIB, not shown) configured between the test head and the probe card 132. The PIB may provide electric coupling between the tester 136 and the probe card 132. The test head, PIB, and probe card 132 are assembled together during testing. To enable or enhance the wafer test system 100, the wafer test system 100 may additionally include other features, such as a spring contactor assembly.

Figure 3:
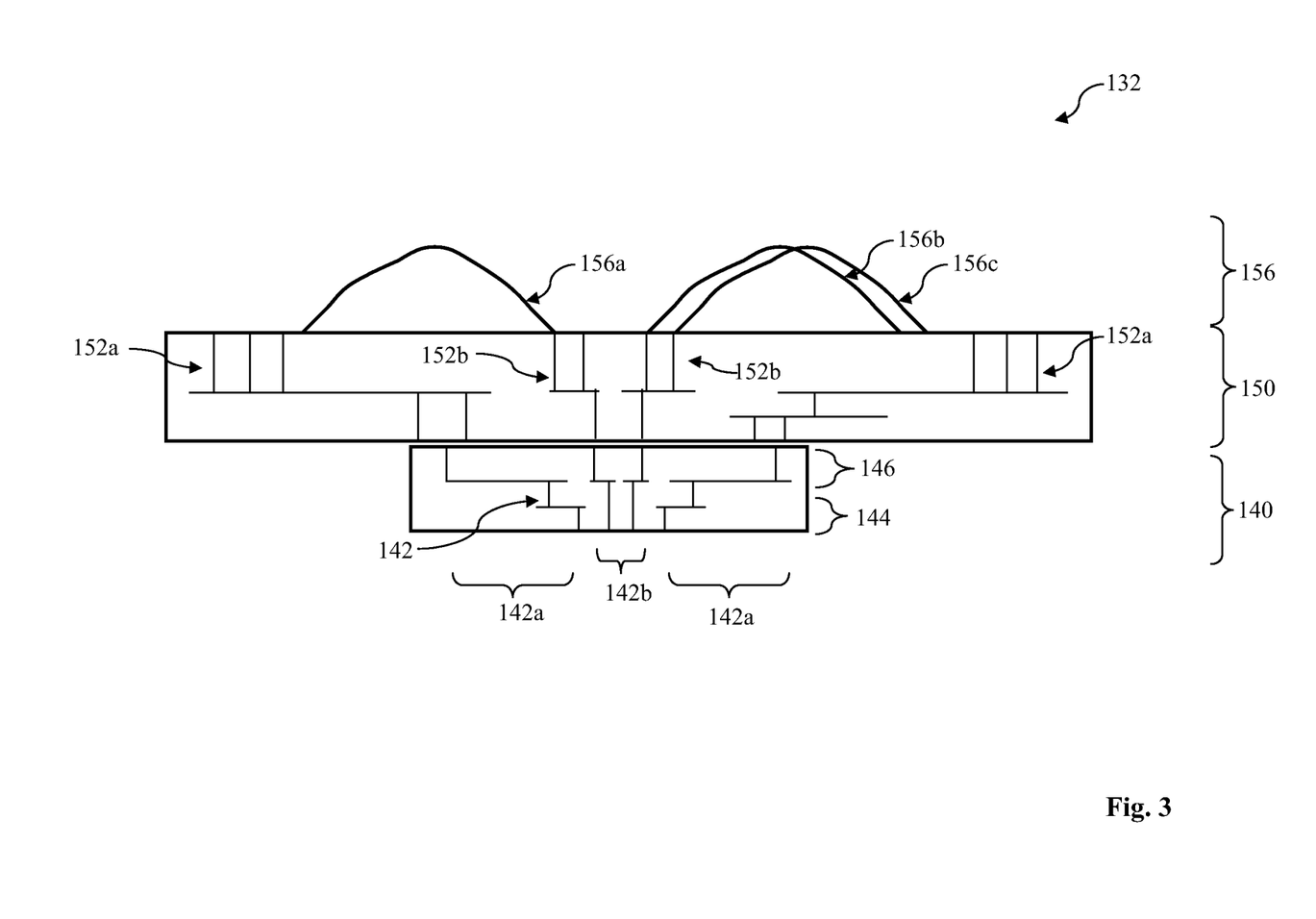
FIGS. 3-7 illustrate schematic views of a probe card incorporated in the wafer-level test system of FIG. 1 constructed according to various embodiments of the present disclosure.

With reference to FIG. 3, the probe card 132 is further described in detail. The probe card 132 includes a space transformer 140. The space transformer 140 may have a structure and materials made of multi-layer organic (MLO) material or multi-layer ceramic (MLC) material. In one embodiment, the MLO material includes bismaleimide triazine (BT) or glass reinforced epoxy laminated sheets.

The space transformer 140 includes various conductive lines 142 for power, ground, and signal interconnection, such as power and ground lines 142a and input/output signal lines (or signal lines or I/O lines) 142b. In one embodiment, the conductive lines 142 are formed in the MLO or MLC material. The conductive lines 142 include a first portion of conductive lines 144 configured in a bottom portion of the space transformer 140, and coupled to the plurality of needles 134. The first portion of conductive lines 144 is configured with a small pitch to be aligned with the plurality of needles 134. The plurality of needles 134 can be aligned with the bonding pads of the wafer 102 by moving the probe card 132. In one embodiment, the first portion of conductive lines 144 has a pitch ranging between about 30 microns and about 200 microns. The conductive lines 142 also include a second portion of conductive lines 146 configured in a top portion of the space transformer 140, and coupled to the first portion of conductive lines 144. The second portion of conductive lines 146 is configured with a large pitch substantially greater than the small pitch. In one embodiment, the second portion of conductive lines 146 has a pitch of about 1 mm or greater. The space transformer 140 thus provides an interface that transforms wiring spacing from the small pitch to the large pitch, such that the small pitch needles and bonding pads can be properly coupled and transformed to the large pitch, to be further coupled to the connection cable 138. In furtherance of the embodiment, when viewing in a direction perpendicular to the space transformer 140, the signal lines 142b are configured in a central region of the space transformer 140, and the power and ground lines 142a are configured in an outer region of the space transformer 140.

The probe card 132 further includes a printed circuit board (PCB) 150 configured adjacent the space transformer 140 and electrically coupled to the space transformer 140, as illustrated in FIG. 3. The PCB 150 includes conductive lines 152, such as power and ground lines 152a and signal lines 152b. In one embodiment, the PCB 150 is laminated with epoxy resin material having the conductive lines 152 embedded therein.

The power and ground lines 152a of the PCB 150 are coupled to the power and ground lines 142a of the space transformer 140 in the top portion of the space transformer 140. The signal lines 152b of the PCB 150 are coupled to the signal lines 142b of the space transformer 140 in the top portion of the space transformer 140. In one embodiment, the signal lines 152b of the PCB 150 are configured in a central region of the PCB 150 and the power and ground lines 152a of the PCB 150 are configured in an outer region of the PCB 150. The power and ground lines 152a are configured in the PCB 150, such that the connection cable 138 can be properly coupled thereto. Particularly, the power and ground lines 152a are configured in a standard design so that the PCB 150 can fit to various types of production wafers when being tested in the wafer test system 100. The signal lines 152b of the PCB 150 cannot be configured in a standard design to fit various types of production wafers since each type of production wafer may have different signal line designs, such as number of the signal lines, configuration of the signal lines, and signal characteristics of the signal lines. In a more particular example, two types of production wafers may have different signal line schemes, and accordingly different connections. In the present embodiment, the signal lines 152b of the PCB 150 and the signal lines 142b of the space transformer 140 are designed to couple all signals from the bonding pads of the wafer 102 in the test region (including one or more dies) to the front surface of the PCB 150.

As noted above, the signal lines 152b cannot fit to various types of production wafers. Additional conductive lines 156 are added to the PCB 150 to fit a particular type of production wafer. The additional conductive lines 156 are made of metal wires, such as copper wires, gold wires, silver wires or metal alloy wires. The additional conductive lines 156 are attached on the front surface of the PCB 150 by a manual technology (manual wiring), such as manual soldering. The additional conductive lines 156 are customized to a particular type of wafer or production wafer, therefore the conductive lines 156 are also referred to as customized conductive wires (customized conductive lines). In FIG. 3, the additional conductive lines 156 include exemplary lines 156a, 156b, and 156c.

The additional conductive lines 156 are implemented to couple the signal lines 152b embedded in the PCB 150 to a region of the PCB 150 reserved and designed for electrical connection to the connection cable 138. In a front surface of the PCB 150, each of the additional conductive lines 156 includes a first end coupled to one of the signal lines 152b, and a second end coupled to a different location of the PCB 150, such that the second end can be properly coupled to the connection cable 138 and further coupled to the tester 136. The location of the second end is associated with a certain type of production wafer. In this case, the probe card 132 is designed specific to that type of production wafer. In one embodiment, the additional conductive lines 156 are coupled to the PCB 150 through bonding features, such as ball grid arrays. Each of the additional conductive lines 156 have two ends attached and bonded to respective solder balls.

Thus, the probe card 132 includes ground/power lines 142a embedded in space transformer 140 and ground/power lines 152a embedded in PCB 150 for providing ground and power supply to a wafer during test by the tester 136. The ground/power lines 142a and 152a are designed to various types of production wafers. The probe card 132 also includes signal lines 142b embedded in the space transformer 140 and signal lines 152b embedded in PCB 150. The signal lines 142b and 152b are designed to various types of production wafers. The probe card 132 further includes additional conductive lines 156 formed on the front surface of the PCB 150. The additional conductive lines 156 are specific to a certain type of production wafer and are manually formed on the front surface of the PCB 150. The signal lines 142b and 152b, and the additional conductive lines 156, provide signal supply to the wafer(s) during testing by the tester 136.

Because the embedded ground/power and signal lines 142 and 152 are designed to various types of production wafers and are incorporated in the space transformer 140 and the PCB 150, respectively, during fabrication of the space transformer 140 and the PCB 150, the space transformer 140 and the PCB 150 are made in a standard design and can be used to test various types of production wafers. However, additional conductive lines 156 are designed specific to a certain type of production wafer and manually incorporated to the PCB 150, enabling the probe card 132 specific to the certain type of production wafers.

By implementing this design and fabrication scheme, the probe card 132 is specific and customized to the certain type of production wafer with substantially improved quality and performance. Particularly, each additional conductive line 156 has both ends connected to different locations of the PCB 150 on the front surface. The manual handling, such as manual soldering, is much easier due to the substantially greater wiring pitch of the PCB 150. Test repeatability and test signal integrity are improved. In contrast, in existing probe cards having manual wiring, each wire is manually soldered to the space transformer at one end and to the PCB at another end. The end to the space transformer is soldered to the space transformer at the surface having the small wiring pitch by passing the wire through a hole of the space transformer. It is very challenging to manually solder since the wiring pitch is small, and therefore, the soldering quality and repeatability are degraded.

Figure 4:
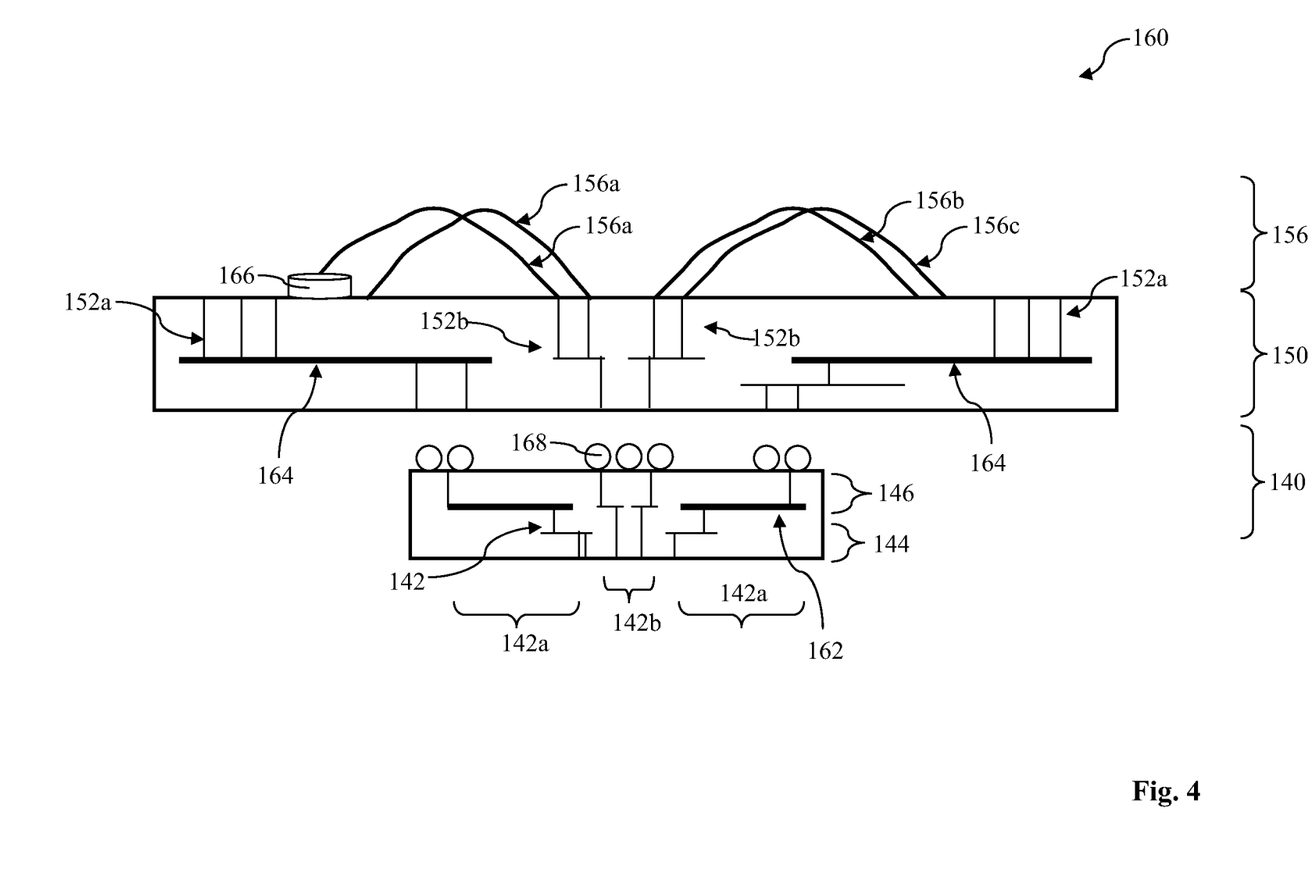

FIG. 4 is a schematic view of another embodiment of a probe card 160 constructed according to one or more embodiments. The probe card 160 can be used in the wafer test system 100 as the probe card 132.

The probe card 160 includes the space transformer 140. The space transformer 140 may have a structure and materials made of MLO material or MLC material. The space transformer 140 includes the various conductive lines 142 for power, ground, and signal interconnection, such as power and ground lines 142a, and signal lines 142b. In one embodiment, the conductive lines 142 are formed in the MLO or MLC material.

The conductive lines 142 include the first portion of conductive lines 144 configured in the bottom portion of the space transformer 140 and coupled to the plurality of needles 134. The first portion of conductive lines 144 is configured with a small pitch to be aligned with the plurality of needles 134. The plurality of needles 134 can be aligned with the bonding pads of the wafer 102 by moving the probe card 132. In one embodiment, the first portion of conductive lines 144 has a pitch ranging between about 10 microns and about 100 microns.

The conductive lines 142 also include the second portion of conductive lines 146 configured in the top portion of the space transformer 140 and coupled to the first portion of conductive lines 144. The second portion of conductive lines 146 is configured with a large pitch substantially greater than the small pitch. In one embodiment, the second portion of conductive lines 146 have a pitch of about 1 mm or greater.

The conductive lines 142 further include one or more embedded conductive plates 162. The embedded plates 162 have two dimensional geometry having structure with a large area. The embedded plates 162 are incorporated in the conductive lines 142 to enhance coupling integrity of the power and ground lines. In one embodiment, the embedded plates have more than one layer.

The probe card 132 further includes the PCB 150 configured adjacent the space transformer 140 and electrically coupled to the space transformer 140, as illustrated in FIG. 4. The PCB 150 similar to the PCB 150 of FIG. 3. For example, the PCB 150 includes conductive lines 152, such as power and ground lines 152a and signal lines 152b. In one embodiment, the PCB 150 is laminated with epoxy resin material having the conductive lines 152 embedded therein. In contrast to the PCB 150 of FIG. 3, the conductive lines 152 of the PCB 150 in FIG. 4 further include one or more embedded conductive plates 164. The embedded plates 164 have two dimensional geometry having structure with a large area. The embedded plates 164 are incorporated in the conductive lines 152 to enhance coupling integrity of the power and ground lines. In one embodiment, the embedded plates have more than one layers.

Additionally, in contrast to the PCB 150 of FIG. 3, the PCB 150 in FIG. 4 includes one or more electrical components 166 formed on the front surface of the PCB 150. The electrical components 166 are active or passive. For example, the electrical components 166 include a capacitor or resistor.

The additional conductive lines 156 are added to the PCB 150 to fit a particular type of production wafer. The additional conductive lines 156 are made of metal wires, such as copper wires, gold wires, silver wires, or metal alloy wires. The additional conductive lines 156 are disposed on the front surface of the PCB 150 by a manual technology, such as manual soldering. In FIG. 4, the additional conductive lines 156 include exemplary lines 156a, 156b, 156c, and 156d. In one example, the additional conductive line 156a is connected to one of the electrical components 166.

In the depicted embodiment, the space transformer 140 and the PCB 150 are bonded together. The conductive lines 142 and 152 are coupled through bonding features, such as solder balls 168.

Figure 5:
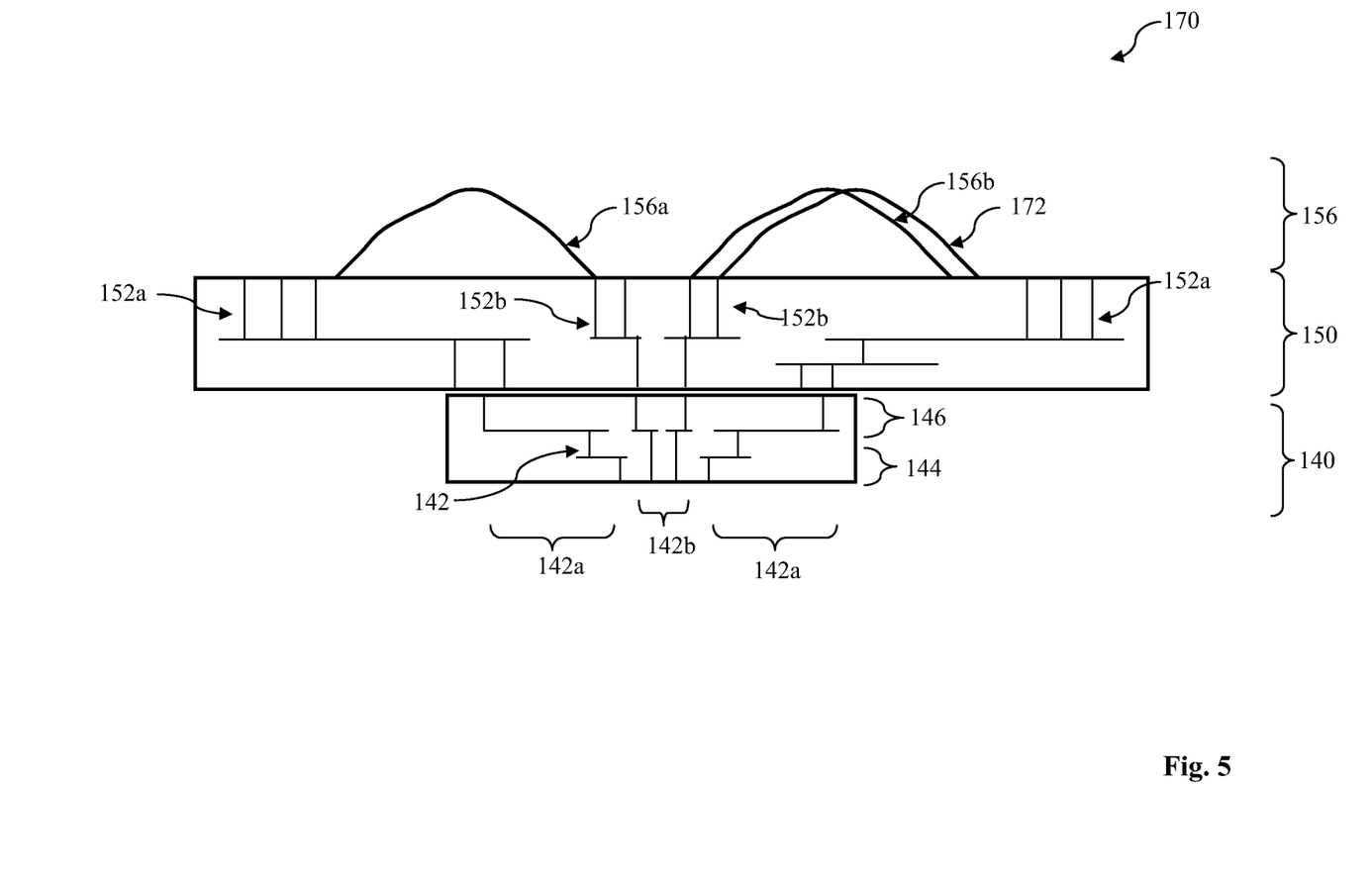

FIG. 5 is a schematic view of a probe card 170 constructed according to another embodiment. The probe card 170 is similar to the probe card 132 of FIG. 3 except for that the probe card 170 includes ground return wiring on dedicated I/O wiring to achieve impedance control behavior. For example, the probe card 170 includes exemplary additional conductive lines 156a, 156b, and 172 configured on the front surface of the PCB 150. In one embodiment, the additional conductive lines 172 include an I/O line and corresponding ground return line configured in a coaxial wire to control impedance behavior.

Figure 6:
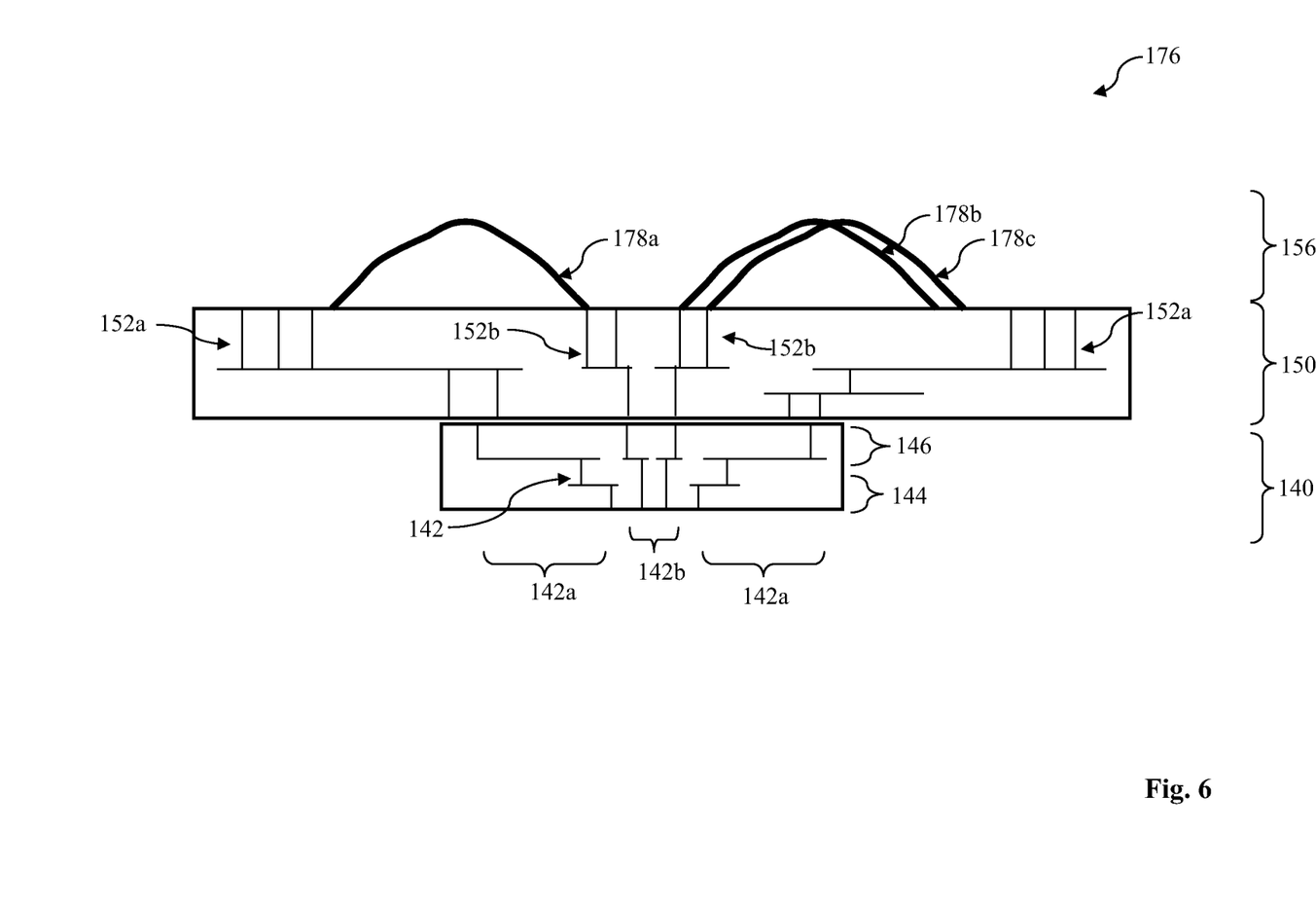

FIG. 6 is a schematic view of a probe card 176 constructed according to another embodiment. The probe card 176 is similar to the probe card 132 of FIG. 3 except for that additional conductive lines 156 are formed using other technology. In the present embodiment, the additional conductive lines 156 include flex ribbon cables, such as exemplary flex ribbon cables 178a, 178b, and 178c. The flex ribbon cables are configured on the front surface of the PCB 150 using corresponding bonding techniques. The probe card 176 uses the flex ribbon cables with pair wiring groups, such as differential wiring pairs. In one embodiment, the flex ribbon cables enable a critical guard trace layout to shield the I/O signal on the flex circuit.

Figure 7:
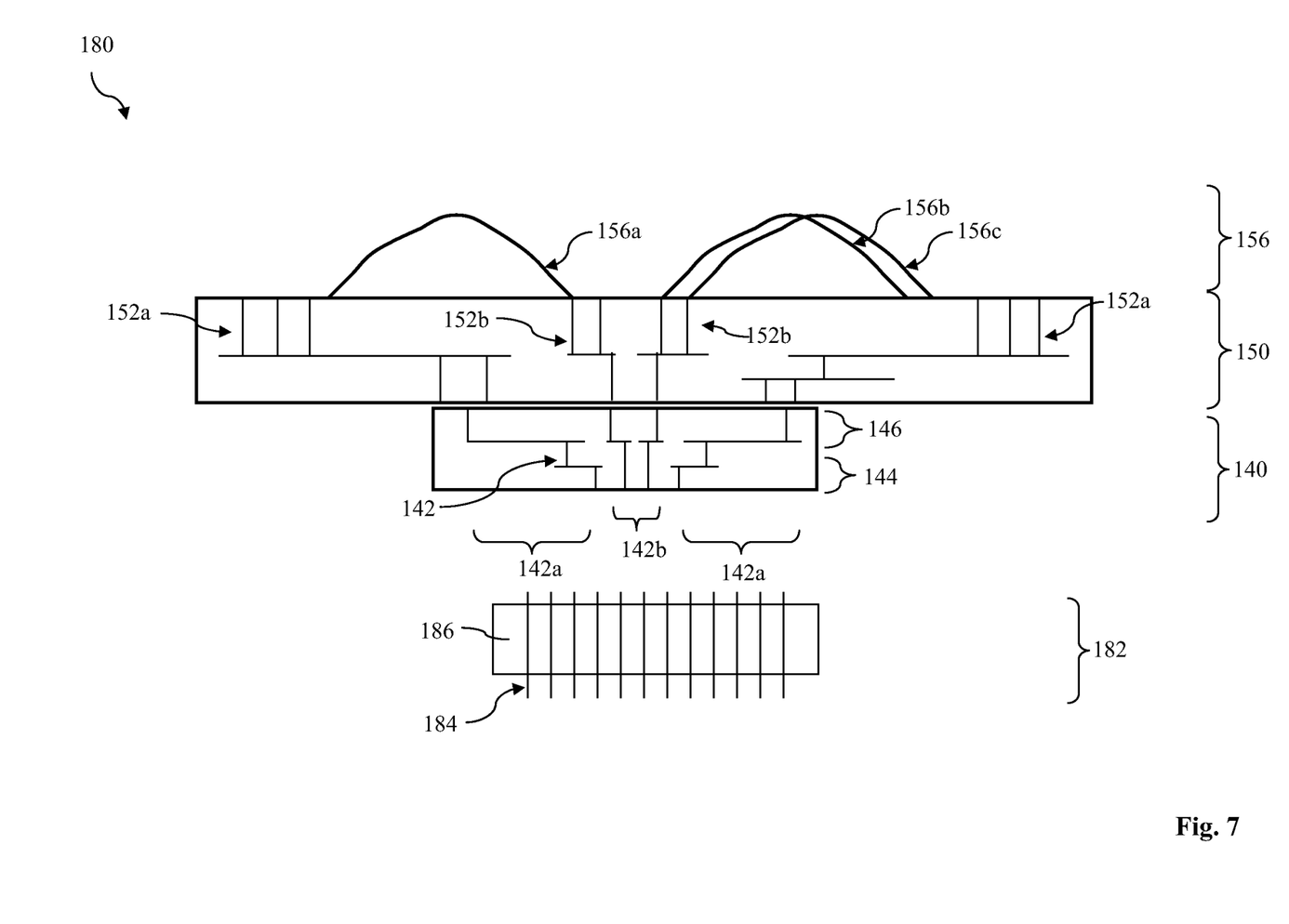

FIG. 7 is a schematic view of a probe card 180 constructed according to various aspects of the present disclosure in another embodiment. The probe card 180 includes the space transformer 140 and the PCB 150 in a standard design. The probe card 180 further includes the customized conductive lines 156 configured on the front surface of the PCB 150. The space transformer 140, the PCB 150, and the customized conductive lines 156 are similar to the corresponding ones of the probe cards illustrated in FIG. 3-6.

In the depicted embodiment, the customized conductive lines 156 include metal lines configured to the PCB 150 by manual wiring. In one embodiment, the customized conductive lines 156 include coaxial cable to incorporate I/O ground return to achieve impedance control behavior, such as those illustrated in FIG. 5. In another embodiment, the customized conductive lines 156 include flex ribbon cables for special I/O wiring to shield the I/O signal on the flex circuit, such as those illustrated in FIG. 6.

In one embodiment, the probe card 180 may further include solder balls configured to bond the power, ground, and signal lines of the PCB 150 and the space transformer 140 as illustrated in FIG. 4. The probe card 180 further includes a needle module 182 integrated with the space transformer 140 and the PCB 150. The needle module 182 includes a plurality of needles (or probes) 184 configured as an array to match the bonding pads in the wafer to be tested. The needles 184 are secured by a matrix 186, such as a Mylar retainer. In one example, the needles 184 match the bonding pads in one die. The probe card 180 is capable of testing multiple dies in parallel. In this case, the needles 184 match the bonding pads of multiple dies, such as 2, 4, 8, or 16. In one embodiment, the needles 184 include tungsten or tungsten/rhenium alloy. In another embodiment, the needles 184 include beryllium copper or palladium. In yet another embodiment, each of the needles 184 has one end that tapers down to a sharp point.

The probe card 180 may further include one or more guide plates (not shown) such as a top guide plate and a bottom guide plate configured above and below the space transformer 140, respectively. The probe card 180 may additionally include one or more spacers (not shown) disposed between the needle module 182 and the bottom guide plate for securing and space control.

Although the present disclosure provides various embodiments of a customized probe card to be used in a wafer test system for wafer level testing, other embodiments may be present without departure from the spirit of the present disclosure. In one example, the flex ribbon cables are designed to form signal lines and the ground return lines to the signal lines for impedance control. In another example, the conductive plates are embedded in the space transformer 140 and the PCB 150 of the probe card 170 in FIG. 5. In another example, the I/O coaxial cables are used to form I/O wiring ground return of the probe card 160 in FIG. 4.

In one embodiment, various power/ground planes having large areas are alternatively or additionally incorporated for enhanced coupling effect and reduced contact resistance. The power/ground planes include conductive surfaces with areas and sizes substantially greater than those of the power/ground lines, thus effectively reducing the contact resistance. In the probe card illustrated in FIGS. 3 and 7, the power/ground lines 152a of the PCB 150 are coupled to the power/ground lines 142a of the space transformer 140, power/ground planes can be embedded in the PCB 150, formed on the surface of the PCB 150, embedded in the space transformer 140, and/or formed on the surface of the space transformer 140. For example, the power/ground planes are embedded in the PCB 150 and are connected to the power/ground lines 152a. In another example, the power/ground planes are formed on the surfaces of the PCB 150 and the space transformer 140 and are aligned so that the power/ground lines coupling between the PCB 150 and the space transformer 140 are through those power/ground planes. Furthermore, the PCB 150 and the space transformer 140 can be bonded together through those power/ground planes on the surfaces indirectly using soldering balls or directly.

In another embodiment, the probe card is not limited to the testing of production wafers. The probe card includes the space transformer 140 and the PCB 150 in a standard design for testing various types of wafers and the additional conductive lines customized for a certain type of wafer. Accordingly, in one embodiment of manufacturing the probe card, the space transformer 140 and the PCB 150 are bonded together. Then, the customized conductive lines are configured on the front surface of the PCB 150. Particularly, each of the customized conductive lines is bonded to one of the signal lines in the PCB 150 at one end and is bonded to another location of the PCB 150 at another end. In another embodiment, the disclosed probe card may be used for a temporary wafer test while the formal probe card is not available. In another embodiment, the wafer test system and the corresponding probe card can be used to test multiple dies simultaneously. In this case, the probe card is configured to test multiple dies in parallel.

Various advantages may be present in various embodiments of the wafer test system 100 in FIG. 1 having a customized probe card such as one of those illustrated in FIGS. 3 through 7. In one embodiment, due to the disclosed scheme, the additional conductive lines configured on the front surface of the PCB 150 have controlled I/O wiring lengths, the test results from one device under test (DUT) to another DUT are consistent and reliable. Particularly, when various customized probe cards are formed by the disclosed scheme and used for wafer testing, the variances from DUT to DUT are minimized since I/O wiring lengths are controlled well from one probe card to another probe card.

In another embodiment, the wiring efficiency is substantially improved due to the wiring on the front surface of PCB 150 with large wiring pitch. During the manufacturing process to fabricate a customized probe card, manufacturing difficulty is substantially alleviated because the space transformer 140 and PCB 150 are made in a standard design and the additional conductive lines are formed on the front surface of the PCB 150 in a customized design with large wiring pitch.

In another embodiment, it is easy to repair the probe card due to large wiring pitch on the PCB. In another embodiment, the disclosed probe card enables high frequency probing due to controlled impedance and low inductance wiring on the I/O channels. In yet another embodiment, the disclosed probe card provides overall power integrity and signal integrity with enhanced testing performance. In yet another embodiment, the customized probe card enables channel rewiring for I/O signals. For example, the disclosed probe card can be easily modified to another customized version for testing another type of production wafers in wafer level. However, the power and ground lines are fixed.

Thus, the present disclosure provides a probe card for wafer level testing. The probe card includes a space transformer having first power/ground lines and first signal lines embedded therein, wherein the first power/ground and signal lines are configured to have a first wiring pitch on a first surface and a second wiring pitch on a second surface, the second wiring pitch being substantially less than the first wiring pitch; a printed circuit bond configured bonded to the first surface of the space transformer, wherein the printed circuit board includes second power/ground lines and second signal lines embedded in the printed circuit board and coupled to the first power/ground and signal lines; and conductive lines configured to a surface of the printed circuit board remote to the first surface of the space transformer, wherein each of the conductive lines includes a first end coupled to one of the second signal lines and a second end coupled to a different location of the printed circuit board.

In one embodiment, the first and second power/ground and signal lines are configured in a standard design for multiple types of wafers and the conductive lines are configured specific to a certain type of wafers. In another embodiment, the conductive lines include one of metal and metal alloy. In furtherance of the present embodiment, the conductive lines are attached to the printed circuit board by manual soldering. In another embodiment, the conductive lines include a coaxial cable for signal and corresponding ground return wiring. In yet another embodiment, the conductive lines include flex ribbon cables. In yet another embodiment, one of the customized conductive lines is coupled to an electrical component formed on the printed circuit board. The probe card may further include a conductive plate embedded in at least one of the space transformer and the printed circuit board. In one example, the first wiring pitch ranges from about 30 micron to about 200 micron; and the second wiring pitch is equal to or greater than 1 mm.

The present disclosure also provides an embodiment of a wafer test system. The wafer test system includes a probe card designed to test a wafer. The probe card includes a space transformer having first power/ground lines and first signal lines embedded therein; a printed circuit bond bonded to the space transformer and embedded with second power/ground lines and second signal lines that are coupled to the first power/ground lines and signal lines, respectively; and conductive lines each having two ends attached to a surface of the printed circuit board remote to the space transformer. The wafer test system further includes a wafer prober designed to hold a wafer to be tested and control the probe card for wafer test; and a tester coupled to the probe card through a connection cable.

In the wafer test system, the first and second power/ground and signal lines are configured in a standard design for multiple types of wafers and the conductive lines are configured specific to a certain type of wafers. Each of the conductive lines includes a first end coupled to one of the second signal lines and a second end attached to the printed circuit board at a location distance away from the first end. The second end is further connected to the connection cable. The first power/ground and signal lines may be configured to have a first wiring pitch on a first surface and a second wiring pitch on a second surface, the second wiring pitch being substantially less than the first wiring pitch. The second power/ground lines and second signal lines are coupled to the first power/ground and signal lines, respectively.

In one embodiment, the conductive lines include one of metal and metal alloy and are attached to the printed circuit board by manual soldering. In another embodiment, the conductive lines include a coaxial cable for signal and corresponding ground return wiring. In yet another embodiment, the conductive lines include flex ribbon cables.

The present disclosure also provides an embodiment of a method of making a probe card. The method includes bonding a space transformer to a printed circuit board; and forming conductive lines on the printed circuit board, wherein each of the conductive lines has a first end bonded to one of signal lines embedded in the printed circuit board and a second end bonded to a different region of the printed circuit board. The signal lines are configured in a standard design for multiple types of wafers and the conductive lines are configured specific to a certain type of wafers.

In one embodiment, the forming conductive lines includes bonding the conductive lines to the printed circuit board by manual soldering. In another embodiment, the forming conductive lines includes forming the conductive lines selected from the group consisting of coaxial cables and flex ribbon cables.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of preparing a wafer test system, comprising:
   determining a probe card design to test a first wafer having a first type of device and a second wafer having a second type of device, wherein the second type of device having a different signal scheme, wherein the determining the design includes:
   defining a space transformer having first power/ground lines and first signal lines embedded therein, wherein the first power/ground lines are disposed in an edge region of the space transformer and the first signal lines are disposed in a central region of the space transformer, the edge region surrounding the central region, and
   defining a printed circuit board (PCB) bonded to the space transformer and embedded with second power/ground lines and second signal lines that are coupled to the first power/ground lines and signal lines, respectively, and wherein the second power/ground lines are disposed in an epoxy material edge region of the PCB and the second signal lines are disposed in an epoxy central region of the PCB, the edge region of the PCB surrounding the central region of the PCB;
   fabricating a first and a second probe card according to the design;
   adding a first set of conductive lines to the first probe card such that the first set of conductive lines are positioned above the PCB and each conductive line having two ends attached to a surface of the PCB remote to the space transformer, wherein the adding the conductive lines is based on the signal scheme of the first device;

adding a second set of conductive lines to the second probe card such that the second conductive lines are positioned above the PCB and each conductive line having two ends attached to a surface of the PCB remote to the space transformer, wherein the adding the conductive lines is based on the signal scheme of the second device.

2. The method of preparing a wafer test system of claim 1, wherein for the first and second sets of conductive lines, each of the conductive lines includes a first end coupled to one of the second signal lines and a second end attached to the printed circuit board at a location a distance away from the first end.

3. The method of preparing a wafer test system of claim 2, wherein the second end is connected to the connection cable.

4. The method of preparing a wafer test system of claim 1, wherein the first power/ground and signal lines are configured to have a first wiring pitch on a first surface and a second wiring pitch on a second surface, the second wiring pitch being substantially less than the first wiring pitch.

5. The method of preparing a wafer test system of claim 4, wherein fabricating the probe card includes providing the second power/ground lines and second signal lines are coupled to the first power/ground and signal lines, respectively.

6. The method of preparing a wafer test system of claim 1, wherein the first and second sets of conductive lines include one of metal and metal alloy and are attached to the printed circuit board by manual soldering.

7. The method of preparing a wafer test system of claim 1, wherein the first and second sets of conductive lines are the conductive lines that include a coaxial cable for signal and corresponding ground return wiring.

8. The method of preparing a wafer test system of claim 1, wherein the conductive lines include flex ribbon cables.

9. A method of making a probe card, comprising:

providing a first and second space transformer and a first and second printed circuit board having signal lines embedded therein wherein the signal lines are configured in a standard design for multiple wafers, each of a first type of wafer and a second type of wafer, wherein the first and second types have a different signal line scheme;

bonding the first space transformer to a first surface of the first printed circuit board having signal lines embedded therein;

determining a first configuration of conductive lines to test the first type of wafer; and forming conductive lines over a second surface of the first printed circuit board according to the first configuration, wherein the second surface opposes the first surface, and wherein each of the conductive lines has a first end bonded to one of the signal lines on the second surface of the first printed circuit board and a second end bonded to a different region of the second surface of the first printed circuit board and wherein each of the conductive lines includes a length between the first end and the second end that is disposes a distance above the second surface of the first printed circuit board;

determining a second configuration of conductive lines to test the second type of wafer; and forming conductive lines over a second surface of the second printed circuit board according to the first configuration, wherein the second surface opposes the first surface, and wherein each of the conductive lines has a first end bonded to one of the signal lines on the second surface of the second printed circuit board and a second end bonded to a different region of the second surface of the second printed circuit board.

10. The method of claim 9, wherein the forming conductive lines on the first and second printed circuit board includes bonding the conductive lines to the printed circuit board by manual soldering.

11. The method of claim 9, wherein the forming conductive lines on the first and second printed circuit board includes forming the conductive lines selected from the group consisting of coaxial cables and flex ribbon cables.

\* \* \* \* \*